United States Patent [19]

Helgeland

[11] Patent Number: 4,663,128

[45] Date of Patent: May 5, 1987

[54] PULLING HEAD FOR A CRYSTAL GROWING FURNACE

[75] Inventor: Walter Helgeland, Lexington, Mass.

[73] Assignee: Ferrofluidics Corporation, Nashua, N.H.

[21] Appl. No.: 709,056

[22] Filed: Mar. 6, 1985

[51] Int. Cl.[4] .......................................... C30B 15/00
[52] U.S. Cl. .................................... 422/249; 156/601; 156/617 SP; 156/DIG. 98; 254/270; 254/293; 254/332; 254/340; 254/344
[58] Field of Search ........ 156/601, 617 SP, DIG. 98; 422/107, 108, 249; 254/270, 293, 329, 332, 340, 344; 74/665 B, 665 C

[56] References Cited

U.S. PATENT DOCUMENTS

| | | | |
|---|---|---|---|
| 3,698,690 | 10/1972 | Beaver | 254/340 |
| 4,161,126 | 7/1979 | Winzeler | 254/344 |
| 4,207,293 | 6/1980 | Scholl et al. | 422/249 |
| 4,301,120 | 11/1981 | Sibley | 422/249 |
| 4,367,199 | 1/1983 | Jericho | 422/249 |
| 4,371,502 | 2/1983 | Sibley et al. | 422/249 |

FOREIGN PATENT DOCUMENTS

| | | | |
|---|---|---|---|
| 2049674 | 4/1972 | Fed. Rep. of Germany | 254/340 |
| 8356 | 1/1979 | Japan | 254/344 |

Primary Examiner—David L. Lacey
Attorney, Agent, or Firm—Wolf, Greenfield & Sacks

[57] ABSTRACT

A pulling head adapted for use with a crystal growing furnace and a crystal growing furnace containing such pulling head, which furnace comprises a high and low speed seed lift motor, a seed rotation motor, a rotatable platform about the upper portion of the furnace, a winch mounted on the platform and adapted for rotation about its own axis to maintain a cable on a central vertical axis, a cable about the winch, one end of the cable adapted to hold a seed crystal within a sealed vacuum or inert atmosphere of the furnace and a multiple-stage planetary gear differential mechanism to receive the output motions of both seed lift motors and the seed rotation motor and to provide a first seed rotation motion output to rotate the platform and a second output to rotate the winch, the second output being the weighted sum of the input motion of the speed ranges of the seed lift motors to provide a seed lift motion which is independent of the speed rotation motor, thereby providing a pulling head which combines the input motions of the seed lift and rotation motors and resolves them into at least two output motions and which permits the seed lift motors to be placed in a stationary condition and spaced apart from the rotatable platform.

11 Claims, 4 Drawing Figures

PULLING HEAD FOR A CRYSTAL GROWING FURNACE

BACKGROUND OF THE INVENTION

Crystal furnaces for the growth of single-crystal ingots by the Czochralski method typically include a crucible contained within a sealed vacuum or an inert environment to contain a melt and a seed lift and rotation mechanism in a pulling head for drawing the crystal from the melt along a vertical axis at a steady rate while providing relative motion about this vertical axis with respect to the melt. Crystal growing furnaces employ a pull or pulling head in order to provide for a seed lift and a seed rotation mechanism and to maintain the mechanical alignment of the axis of rotation of the seed with the vertical pulling axis of the seed. The single ingot crystals are grown from a seed crystal, which seed crystal is held in a chuck or other means so that the seed crystal may be lifted and rotated. The means for lifting and rotating the seed crystals is frequently a flexible, elongated member, such as a cable or bead chain, which cable or chain is raised by a winch mechanism. The winch is mounted on a rotatable platform mounted on a platform on the upper portion of the crystal growing furnace. The entire winch mechanism to which the cable or chain is secured is secured to the platform for rotation therewith, so as to provide for rotation of the cable or chain, so that at the same time the seed, chuck, and crystal are made to rotate the winch is lifting the seed crystal from the melt enclosed in a sealed vacuum or inert atmosphere.

Generally, both high and low speed seed lift motors are employed on the rotatable platform with the seed lift motors usually having a respective defined high and a low speed range. The motors are mechanically combined on the platform by using differential or clutch means, so as to combine the motion of the two motors on the platform. The seed rotation motor is usually not mounted on the platform, but is mechanically coupled to the platform through a drive belt to rotate the platform. In order to control adequately the crystal growing process both the seed lift and the rotation rate must be independently controllable. In addition, it is convenient to provide two or more separate speed ranges for the seed lift motion. Thus, the seed lift and rotation mechanism for crystal growing furnaces comprises both a high speed and a low speed lift motor and a rotation motor all mechanically combined to a winch which must rotate about its own axis to raise the seed crystal and which also may translate along its axis, such as by a spline and lead screw at the time of winch rotation to maintain the cable or chain on the central vertical pulling axis. The crystal growing furnace pulling head for use with a flexible chain is described, for example, in U.S. Pat. Nos. 4,301,120 and 4,371,502.

At present, the pulling heads for crystal growing furnaces are quite complex and cumbersome and involve at least two motors with the associated electric wiring controls, a winch, a cable or a chain all mounted on a rotatable platform which makes adjustment, alignment, and maintenance of the pulling head mechanism quite complex and difficult. In addition, the heavy mass on the rotatable platform requires that the platform be carefully balanced and constructed to support the weight, while there also is a requirement for electrical slip rings in order to provide electrical power to the motors and electrical sensing of speed- and position-transducer signals on the platform while the platform is rotating. Accordingly, there is a need for a simplified, less complex, easily maintained, and more effective pulling head for use with crystal growing furnaces.

SUMMARY OF THE INVENTION

The invention relates to a planetary differential gear mechanism, a pulling head containing such mechanism adapted for use with crystal growing furnaces and to crystal growing furnaces containing such pulling heads, and to a method of operating the mechanism and pulling head for the lifting and rotation of a seed crystal.

A seed lift and rotation mechanism; that is, a pulling head for use with a crystal growing furnace has been discovered, which mechanism combines the input motions of the plurality of seed and rotation motors and resolves the input motions (n) into output motions of (n−1). In particular, the seed lift and rotation mechanism combines the input motions from the shaft of a high speed seed lift motor, a low speed seed lift motor, and a seed rotation motor and resolves these input motions into two output motions, in which the two seed lift input motions are added to form a weighted sum which comprises the seed lift motion, while the third input motion becomes the speed rotation motion. As in the prior art, a winch or means to secure a cable, chain or other flexible member is mounted on a rotating platform and placed on the upper portion of the crystal growing furnace as is common practise and the winch is adapted for rotation about a vertical axis and is adapted to maintain the cable on a central vertical axis, such as by translatory motion of the winch by a spline with a fixed nut and lead screw on the winch or as in Sibley et al U.S. Pat. No. 4,371,502 with a nontranslatory sprocket or driving mechanism. However, in contrast to the prior art there are no drive motors, clutches, switches or other electrical components mounted on the platform, but rather, the high speed, low speed, and seed rotation motors are all mounted on a stationary frame apart from and not on a platform. The output motions of the high and low seed lift and rotation motors are taken from the output shafts and mechanically combined or coupled to a compound planetary gear differential mechanism which resolves the three rotary input motions to the two rotary output motions required for the operation of the pulling head; that is, a weighted seed lift rotation motion and a seed rotation motion.

As compared to the prior art pulling heads, the invention posesses several significant advantages in that the pulling head of the invention contains a minimum number of elements on the rotating platform, thereby simplifying the adjustment, the alignment, and maintenance of the winch mechanism. In addition, there is no need for electrical slip rings, thereby eliminating the maintenance, unreliability, and electrical noise problems associated with the use of slip rings as in the prior art pulling heads. Further, the pulling head can be built as ruggedly as desired while only minimally increasing the amount of rotating mass on the rotating platform, thereby rendering the design approach of the invention especially suitable for pulling heads intended to handle very heavy crystals. In the pulling head of the invention the degree of overhang of the rotating mass is significantly minimized thereby simplifying the task of balancing the rotating platform and eliminating vibrations in the rotating platform system. The invention permits if desired the elimination of drive belts so that the requirements for proper tensioning and maintenance of drive belts is also eliminated. The high speed seed lift motor, the low speed seed lift motor, and the seed rotation motor are stationary and their respective outputs based on the rotation of their respective shafts are combined to provide for a rotating shaft output which controls the seed lift which is a weighted sum referenced to the rotating platform, while the input motion is referenced to the earth and the motions of the stationary motors are all controlled independently of each other.

The pulling head of the invention is adapted for use with a crystal growing furnace, but also may be employed with other furnaces and devices where independently controlled lift and rotation is important or necessary. The pulling head typically comprises a stationary seed lift motor which may have a plurality of speeds, and generally includes a high speed seed lift motor and a low speed seed lift motor, respectively having a high and low speed range and output shaft based on the range of the high and low speeds. In addition, there is a stationary seed rotation motor having an output rotation shaft. The pulling head includes a rotatable platform which is positioned for rotation on the upper portion of the crystal growing furnace for rotation about a vertical axis through which the seed crystal will be lifted. A winch or other cable, chain or flexible rotating means is secured and mounted on the platform with the winch mounted for rotation about its own axis and typically but not necessarily mounted for translatory movement along its axis on the platform. A flexible member, typically a cable, is secured about the outer surface of the winch, adapted at one end to hold a chuck to retain a seed crystal to be lifted from the melt of the crucible within the furnace. The cable is adapted for rotation through the rotation of the platform to which the winch is secured and also adapted for vertical movement along the vertical axis of the crystal to lift the seed crystal from the melt in the furnace.

The pulling head also includes a multiple-stage planetary differential mechanism which is designed in a number of stages as required to receive the motions of the high speed, low speed, and rotation input shafts of the stationary motors and to provide in the third stage a first seed rotation motion output for rotating the platform and a second motion output to rotate the winch about its own axis and therefor, to provide a summed seed lift motion which is the weighted sum of the input motions of both the high and low speed motors to obtain a seed lift motion which is independent of the seed rotation motion of the platform. If desired, the pulling head may include a third output motion to provide a means of sensing the seed lift rate and the position of the seed.

The pulling head employs a series of separate planetary differential gear stages in order to combine a plurality of motor motions (n) and to obtain an output motion or motions(n−1). The planetary differential gear system may be made with helical, spur or other gear mechanisms and typically is made with large gears which makes it easy to build with extreme ruggedness. Each of the planetary gear stages has five gears and a number of different stages may be combined as desired. However, typically at least three stages are used in a pulling head to provide two independent motions; that is, the seed lift motion and the seed rotation motion.

The planetary differential mechanism preferably employs gears; however it is recognized that the differential mechanism may also employ belt driven pulleys instead of gears. While pulleys may have less vibration or noise than gears, the use of pulleys is less desirable due to problems associated with slippage, wear, maintenance, tensioning, and the difficulty of maintaining exact ratios. Further, in crystal growing furnaces the crucible with the melt is maintained in a vacuum chamber or in an inert atmosphere and seals such as static and ferrofluid seals are typically employed to maintain a vacuum or inert atmosphere.

The invention will be described for purposes of illustration only in connection with a three stage differential system for use in a pulling head for a crystal growing furnace; however, it is recognized that various changes, additions, and improvements may be made by those persons skilled in the art all falling within the spirit and scope of the invention.

DESCRIPTION OF THE EMBODIMENTS

Figure 1:
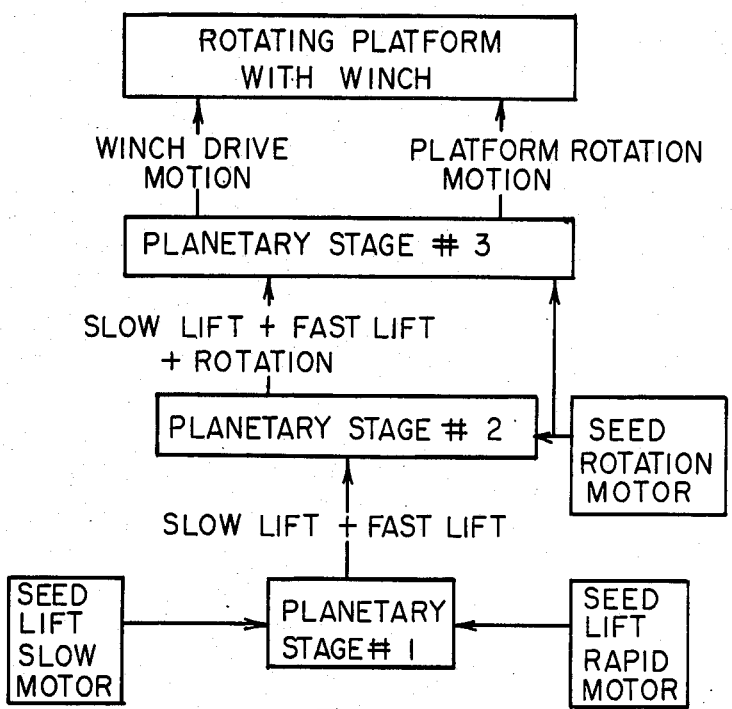
FIG. 1 is a schematic, illustrative block diagram of a pulling head illustrating the use of three planetary stages in combination with a slow seed lift, a rapid seed lift, and a seed lift rotation motor in which in the input motions of the motors are resolved into two output motions.

FIG. 1 is a schematic illustration of a block flow diagram of the pulling head which involves the use of three separate planetary gear stages with each stage comprising a set of five gears in a planetary differential gear arrangement. As shown more particularly in FIG. 2 the set of gears in each stage can accept two input motions which are then combined into a complex planetary output motion. Stage 1 receives the input motions of the rotary shaft of the seed lift rapid or high speed motor and the seed lift slow motor, each of the motors having a selected and defined speed range, such as a speed range of 0.1 to 15 inches per hour for the low speed motor and a speed of 0.5 inch per second or more for the high speed motor. The rotary shaft of the low and high speed lift motor represents the rotary shaft input into planetary stage 1 and the output from planetary stage 1 represents the combined input of the seed lift motor.

Planetary stage 2 then combines the seed rotation input motion from the seed rotation motor with the combined output of planetary stage 1. The output from planetary stage 2 contains all of the motion information needed to operate the final mechanism of the pulling head in the crystal growing furnace with the three basic input motions combined (low speed lift, high speed lift, and rotation speed); however, the seed lift motion is not independent of the rotation motion. The output of planetary stage 2 cannot be directly coupled to the rotating platform and winch of the pulling head. A third planetary stage is required to provide a separate motion for the rotary platform; that is, a disk motion and a shaft motion for the winch, otherwise the planetary stage motion drives the shaft output also, so a third planetary stage is required to provide the exact amount of cancellation in order to obtain two controlled independent output motions, one to the platform rotation and one for the seed lift.

Planetary stage 3 as illustrated receives the rotary input motion from planetary stage 2 and also the rotary input motion of the seed rotation motor and combines the output from planetary stage 2 with the seed rotation motor output to separate the motion desired for the winch drive (i.e. seed lift) from that desired for the platform rotation (i.e. seed rotation) with the overall result that the winch drive motion is in the rotating reference frame of the rotating platform and is exactly the weighted sum of the two seed lift motor motions (high and low) and the platform rotation motion is the direct reflection of the seed rotation motor. The slow and high seed lift motor need not be placed on a rotary platform and may be made stationary and need only have their output shafts mechanically coupled to the rotary input shafts of the planetary stages 1, 2, and 3 as illustrated in the block flow diagram.

Figure 2:
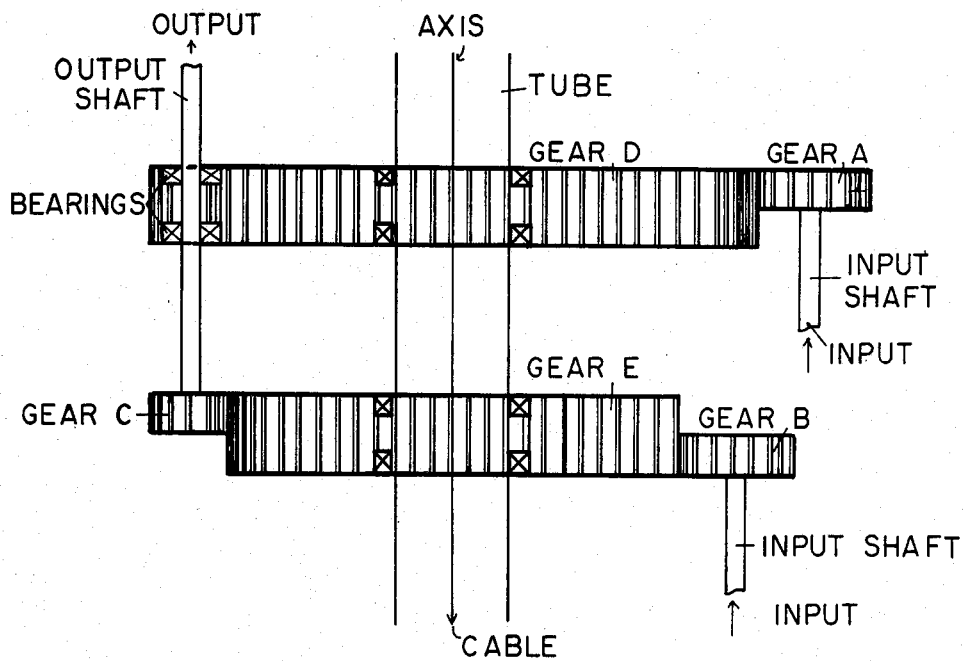
FIG. 2 is a schematic, illustrative view of a basic planetary stage employed in the pulling head of the invention.

FIG. 2 is a schematic, illustrative, partially sectional and elevation view of a single planetary gear stage and for example, will be described with reference to planetary stage 1 of FIG. 1. As illustrated, the planetary gear stage comprises five spur-type gears, A, B, C, D, and E with an input shaft for gear A and an input shaft for gear B, so that on rotation of the respective input shafts, gears A and B turn and thus turn large spur gears D and E. Gear C meshes with gear E and turns with the turning of gear E and has an output shaft secured thereto for rotary motion with gear C, which shaft extends in bearings through gear D, so that output shaft moves about its own axis and also with respect and about the central vertical axis of the pulling head and as a satellite of the movement of gear D. As illustrated, the single planetary gear stage shown has gears D and E mounted in bearings on a hollow tube for rotation thereabout with the central axis of the tube representing the vertical axis of the chain or cable employed in the pulling head of the crystal growing furnace.

It is not necessary that any main gear D or E about the central shaft be secured for rotation with the main cable shaft and in any event not more than one main gear should be secured to the main shaft.

As illustrated, certain relationships must be maintained with regard to the respective gear ratios within and between each of the planetary gear stages. Each input shaft for gears A and B can have either a simple or a compound rotary motion. In the simple case, the shaft turns only about its own centerline. In the compound case, the shaft turns about its own centerline while its centerline is simultaneously caused to orbit about the main axis of the system. The orbiting motion, if present, always maintains parallelism between the main system axis and the axis of the input shafts for gears A and B. Gears D and E rotate about the tube and the main system axis. The shaft of gear C is mounted in bearings in gear D. Hence, gear C can travel in a planetary motion (turning on its own shaft axis while its shaft axis orbits about the main system axis). The rotary input motions are transmitted to the output gear C via gears D and E. The rotary output motion of one stage becomes the rotary input motion to another planetary stage.

In order to characterize the planetary gear mechanism let the gear variables be defined as follows:

NA = number of teeth in gear A
NB = number of teeth in gear B
NC = number of teeth in gear C
ND = number of teeth in gear D
NE = number of teeth in gear E Then three ratios of interest can be defined as follows:

$$RA = NA/ND$$

$$RB = NB/NE$$

$$RC = NE/NC$$

Now define the velocity variables as follows:
wA = angular velocity of gear A about its own axis
WA = orbital angular velocity of gear A's axis about the main system vertical axis (cable axis)
wB = angular velocity of gear B about its own axis
WB = orbital angular velocity of gear B's axis about the main system axis
wC = angular velocity of gear C about its own axis
WC = orbital angular velocity of gear C's axis about the main system axis Two equations of motion define the output of this device:

$$wC = RC*[wB*RB - wA*RA + WA*(1+RA) - WB*(1+RB)] - WA*RA + WA*(1+RA) \quad \text{Eq (1)}$$

$$WC = -wA*RA + WA*(1+RA) \quad \text{Eq (2)}$$

These equations permit the output of such a planetary stage to be calculated from its inputs and from the three basic gear ratios employed in the stage.

Now consider a three-stage device as outlined in FIG. 1. Each stage is internally similar to the planetary stage shown in FIG. 2. The outputs of stages 1 and 2 become inputs to other stages. The motors are stationary. Using an additional numerical subscript to denote the stage being referenced, the equations of motion for the two outputs are:

$$\text{platform rotation} = wD3 = -wA3*RA3 \quad \text{(Eq 3)}$$

winch drive = wC3, where $$wC3 = RB3*RC3*[RA1*RC2*(1-RB2*RC1) - *wA1 + RB1*RC1*RB2*RC2*wB1] + wD3 \quad \text{Eq (4)}$$

provided the following relationship is adhered to:

$$RA3/RA2 = 1 - RC2*RB3 \quad \text{Eq (5)}$$

Equation 5 is the key condition to make the winch drive motion, relative to the platform, independent of the platform rotation motion.

Since wA1, wB2, and wA3 are simply the velocities of the three independent input motors, it can be seen from equations (3) and (4) that the seed lift and rotation motions are related as desired to the three input motors. The final term of equation (4) is exactly correct to cancel the platform rotation motion out of the winch motion.

Thus, as illustrated, each of the planetary stages has five gears and in the employment of the planetary stage mechanism in a pulling head for a crystal growing furnace at least three stages are required with the third stage required in order to obtain two independent motions from the seed lift and the seed rotation motion. The output shaft of each of the stages moves like a planet of gear D about the main axis system and also rotates in response to the rotary movement of gear C as it rolls about the external periphery of gear E about the main axis shaft and gear E acts as an idler and connects the rotary input motion of gear B to the rotary motion of gear C. In the third planetary stage, the rotating platform represents gear D and the output shaft of the third planetary stage is the rotary shaft for the winch to rotate about its axis and to lift the seed crystal.

As an illustrative specific example of a three-stage planetary gear system used in a pulling head and placed on a low speed lift motor having a low speed velocity of 0 to 50 rpm and a high speed motor having a velocity of 0 to 375 rpm. The following gear variables, ratios, and velocities are employed:

| SPECIFIC EXAMPLE OF GEARING | | | | |
|---|---|---|---|---|
| | | STAGE | | |
| | | 1 | 2 | 3 |
| 1. GEAR DATA | | | | |
| 1.1 No. of teeth | A | 25 | 80 | 48 |
| | B | 38 | 40 | 24 |
| | C | 30 | 40 | 48 |
| | D | 175 | 160 | 192 |
| | E | 90 | 80 | 96 |
| 1.2 Diameter (mm) | A | 31.25 | 100.00 | 60.00 |
| | B | 47.50 | 50.00 | 30.00 |
| | C | 37.50 | 50.00 | 60.00 |
| | D | 218.75 | 200.00 | 240.00 |
| | E | 112.50 | 100.00 | 120.00 |
| 2. RATIOS (calculated from gear data) | | | | |
| NA/ND = RA | | 25/38 | 1/2 | 1/4 |
| NB/NE = RB | | 38/90 | 1/2 | 1/4 |
| NE/NC = RC | | 3 | 2 | 2 |
| 3. RANGES OF RATIOS | | | | |
| | | Min | Max | |
| RA | | 1/10 | 10 | |
| RB | | 1/10 | 10 | |

Figure 3:
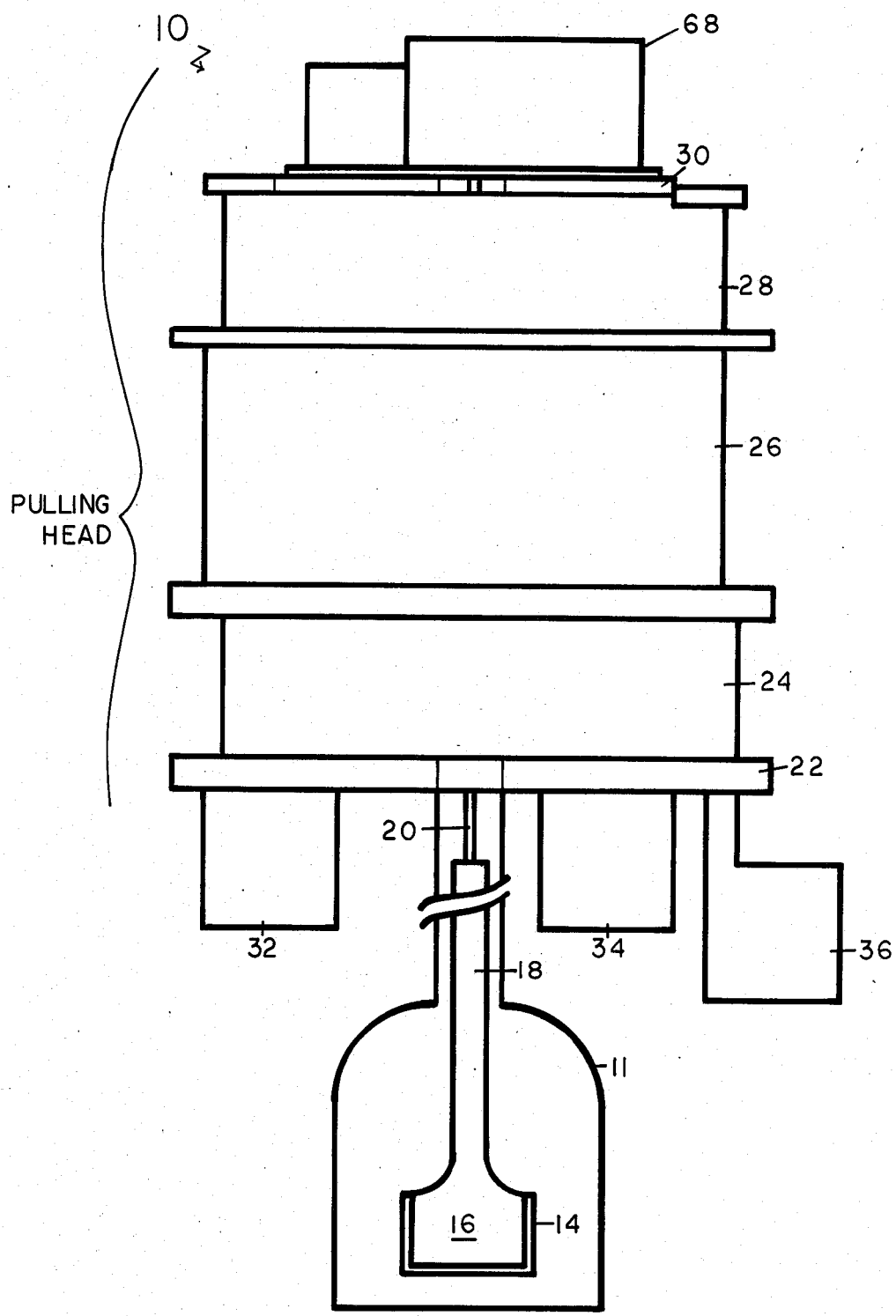
FIG. 3 is a schematic, illustrative partially sectional view of a crystal growing furnace containing the pulling head of the invention.

FIG. 3 is a partial sectional schematic view of a crystal growing furnace 10 with a pulling head of the invention having three stages 24, 26, and 28. The furnace 10 includes a vacuum-sealed container II with extending hollow shaft 12 in which a crucible 14 is disposed, the crucible 14 containing a melt of refractory material 16 such as silicon to be formed into a crystal 18. The crystal 18 is pulled from the melt 16 by the pulling head through a cable 20 extending within the hollow shaft 12 on a central vertical axis from a translatory cable winding winch (see FIG. 4) within a vacuum-sealed enclosure 68 positioned on a rotatable platform 30 of the pulling head, which platform is the uppermost gear of the third stage 28 of the pulling head. The pulling head is secured to a base 22, a low speed lift motor 32, and a high speed lift motor 34 provides controlled lifting of the crystal 18 by cable 20, which motors are stationary and not mounted on the rotatable platform of the pulling head. A seed rotation motor 36 provides for controlled rotation of the platform 30, the rotary output shafts of the motors 32, 34, and 36 provide rotary input motion to the first and second stage of the pulling head as described more particularly in FIG. 4.

Figure 4:
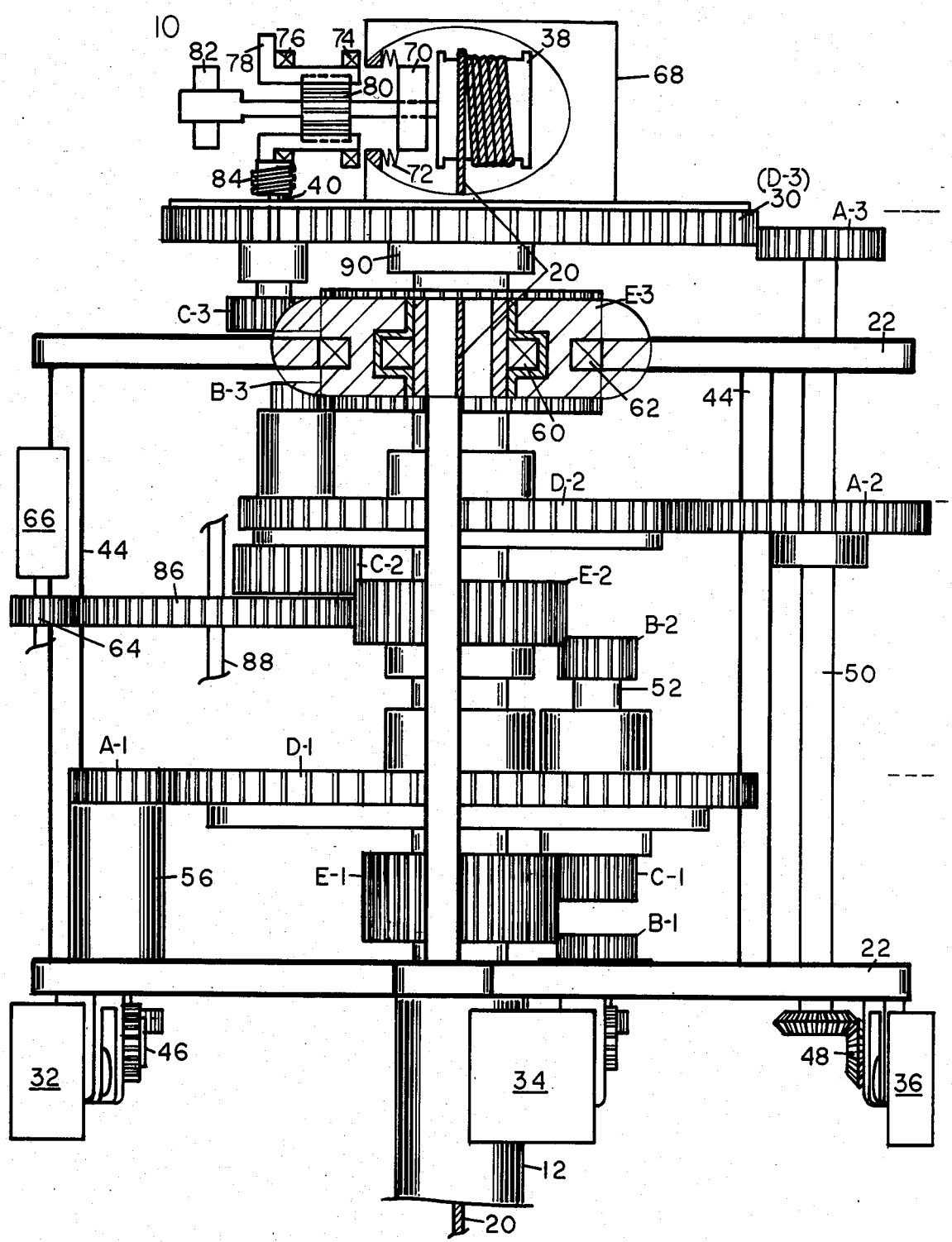
FIG. 4 is an enlarged schematic, partially sectional view of the pulling head of the invention shown in FIG. 3.

FIG. 4 shows the three stage pulling head of FIG. 3 in more detail and wherein the gears are identified alphabetically as in FIG. 2 for each stage followed by a numeral to designate the particular stage, e.g. E-1 is gear E in the first stage, C-3 is gear C in the third stage, etc., with gear D-3 representing the rotatable platform 30 with the hollow tube 12 representing the shaft for the cable 20. The pulling head is secured between supports 22 on posts 44 by a bottom static vacuum seal (not shown) to the top of the container on shaft 12 and by a vacuum-tight rotary seal 90 on the bottom of the rotatable platform 30 such as by a ferrofluid rotary seal apparatus. Within the vacuum enclosure 68 on platform 30 is a winch 38 which rotates about its axis to raise or lower the cable 20 and which also undergoes translatory motion to maintain the cable 20 on the central axis within the pulling cable tube or shaft 12. The platform 30 (D-3) rotates about the top of the shaft 12, while the other central gears, i.e. D-1, E-1, D-2, and E-2 are mounted for rotary movement on bearings about the central shaft 12 as shown in FIG. 2. Gear E-3 contains both inner 60 and outer bearings 62. The inner bearings 60 permit gear E-3 to rotate about the central shaft or tube 12 while holding concentrically between the central shaft and gear E-3. The outer bearing 62 permits gear E-3 to rotate relative to the fixed base 22, while providing lateral support for gear E-3 and hence for the central shaft 12 which passes through gear E-3.

The enclosure 68 contains the winch 38 and a rotary shaft seal 70 about the driving shaft of the winch 38 which is secured to a bellows 72 sealed to one wall of the enclosure to provide a protected or vacuum-sealed environment for the winch operation (see U.S. Pat. No. 3,612,549, issued Oct. 12, 1971). Outside of enclosure 68 a worm gear 78 drives the outer member of a spline 80 with the length and width of the spline adjusting to support the overhang load or winch on the inner member of the spline 80. The outer end of the spline 80 is engaged with a fixed nut 82 secured to platform 30 (D-3) which forces the translatory motion of the winch with the rotation of the plateform 30. The worm gear 78 is matingly engaged with worm 84 through rotary output shaft 40 extending in bearings through D-3 from gear C-3 to rotate winch 38 and raise and lower the cable 20.

The fast seed lift motor 34 provides an input rotary motion to gear B-1 while slow seed lift motor 32 through gear 46 provides an input rotary motion through shaft 56 to gear A-1 to provide a combined input rotary motion through output shaft 52 to gear B-2 in the second gear stage. The rotary output of the seed rotation motor 36 through gear 48 is provided via shaft 50 to gear A-2 in the second stage and to gear A-3 in the third stage to drive platform 30 (gear D-3) while the rotary output of gear C-3 through shaft 40 operates the winch 38 in enclosure 68.

Optionally as illustrated, there is provided a sensing device 66 to convert the rotary motion of the second stage to an electrical signal for control purposes. The sensing device 66 may be a rotary encoder which converts the revolution of central gear E-2 into electrical pulses through an idler gear 86 on a shaft 88 and driving gear 64. The rotary encoder 66 provides an electrical pulse stream to a central computer or electrical control to provide determination of the movement rate of the seed crystal and the position of the seed crystal in the shaft. If desired, the rotary motion may be used to drive linearly a threaded element with a fixed nut on one or both ends thereon so that at the end of travel a microswitch is operated to start and/or stop the seed drive mechanism.

The use of a series of planetary differential gear or pully or a combination thereof stages represents a novel mechanical arrangement mechanism and method of combining a plurality, e.g. three motor motions into a lesser plurality (n−1), e.g. two output motions with one of the output motions being the sum of two of the motions. It is recognized that the described structure and principle of single or multiple planetary stages may be extended to other mechanical apparatus, applications and uses and for example may be employed where there are two or three or more input drives. The pulling head employing the three-stage planetary stages of the invention provides significant advantages over prior art pulling heads and crystal growing furnaces.

What is claimed is:

1. A crystal pulling head for use with a crystal growing apparatus that causes a growing crystal to be pulled along a vertical axis and is simultaneously rotated about that axis, the pulling head having a longitudinal axis, the pulling head comprising,
    a multiple-stage planetary differential means having first, second and third differential planetary gear stages disposed about the longitudinal axis, each of the stages having two rotary input shafts and a planetary output shaft whose rotary speed is the weighted sum of the input shaft speeds,
    a first seed-lift motor connected to one of the first stage input shafts,
    a second seed-lift motor connected to the other of the first stage input shafts,
    means connecting the first stage output shaft to one of the second stage input shafts,
    a seed-rotation motor connected to the other of the second stage input shafts,
    means connecting the second stage output shaft to one of the third stage input shafts,
    means connecting the seed rotation motor to the other of the third stage input shafts,
    a winch mounted on a platform which is connected to, and rotates with, one the gears in the third stage, and
    means connecting the winch to the third stage output shaft to cause the winch to rotate and draw up a crystal.

2. A crystal growing furnace for growing crystals by the Czochralski method, which furnace comprises:
    (a) a crucible to contain a melt of refractory material;
    (b) an environment means for the growth of a crystal from the melt;
    (c) a melt in the crucible containing the material from which the crystal is grown; and
    (d) the pulling head of claim 17 mounted on an upper portion of the crystal growing furnace, to provide for the independently controlled lifting and rotating of the crystal from the melt in the environment means.

3. The pulling head of claim 1 wherein each stage of the multiple-stage planetary differential means comprises:
    (a) a first central gear E mounted for rotary movement about the longitudinal axis;
    (b) a second central gear D defining said rotatable platform mounted for rotary movement about the longitudinal axis;
    (c) a third gear B in an intermeshing gear relation with the first gear E to drive the first gear E on rotation of the third gear B;
    (d) a fourth gear C in an intermeshing relationship with the first gear E which fourth gear C is driven by the motion of the first gear E; and
    (e) a fifth gear A in an intermeshing relationship with the second gear D to drive the second gear D on rotation of the fifth gear A.

4. The pulling head of claim 3 wherein the winch means is connected to the central gear D of the third stage and the third stage gear D while all other central gears of the first, second, and third stages have bearing means to provide for rotation about the longitudinal axis.

5. The pulling head of claim 3 which includes a rotary encoder in a driven relationship with central gear E of the second stage which provides an electrical sensing signal so that the position and rate of movement of a seed crystal along the longitudinal axis can be determined.

6. The pulling head of claim 3 wherein the planetary gear differentials have a range of ratio as follows:

|    | Min  | Max |
|----|------|-----|
| RA | 1/10 | 10  |
| RB | 1/10 | 10  |
| RC | 1/10 | 10  | wherein RA is the ratio of number of gear teeth of gear A to gear D, RB is the ratio of the number of gear teeth of gear B to gear E, and RC is the ratio of the number of gear teeth of gear E to gear C.

7. The pulling head of claim 1 wherein the winch means includes means for the translatory movement of the winch means with the rotation of the platform to maintain the cable means on the longitudinal axis of the shaft while moving a seed crystal along the longitudinal axis.

8. The pulling head of claim 1 which includes a sensing means which provides a sensing signal from the planetary differential means that permits the determination of the rate of movement and position of a seed crystal along the longitudinal axis.

9. A crystal growing furnace for growing crystals by the Czochralski method, which furnace comprises:
    (a) an enclosed chamber to provide an inert or vacuum environment for the growth of crystals;
    (b) a central hollow shaft having a central axis and extending vertically from the chamber;
    (c) a first seed lift motor having a rotary shaft output with a first rotary speed range;
    (d) a second seed lift motor having a rotary shaft output with a second rotary speed range;
    (e) a seed rotation motor having a rotary shaft output;
    (f) a three-stage planetary gear differential means, the first stage of the gear means comprising;
        a first sun gear rotating about the central shaft,
        a second sun gear located above the first sun gear and mounted for rotary movement about the central shaft,
        a first planet gear connected to the rotary output shaft of the first seed lift motor, the first planet gear intermeshing with the first sun gear,
        a second planet gear connected to the rotary output shaft of the second seed lift motor, the second planet gear intermeshing with the second sun gear, and
        a third planet gear intermeshing with the first sun gear and connected to a first shaft which projects through the second sun gear to provide a combined rotary output motion;
    the second stage of the planetary gear means comprising;
        a third sun gear rotating about the central shaft, a fourth sun gear located above the third sun gear and mounted for rotary movement about the central shaft, a fourth planet gear connected to the first shaft, the fourth planet gear intermeshing with the third sun gear, a fifth planet gear connected to the rotary output shaft of the seed rotation motor, the fifth planet gear intermeshing with the fourth sun gear, and a sixth planet gear intermeshing with the third sun gear and connected to a second shaft which projects through the fourth sun gear to provide a combined rotary output motion;

the third stage of the planetary gear means comprising, a fifth sun gear rotating about the central shaft, a sixth gun gear located above the fifth sun gear and mounted for rotary movement about the central shaft, a seventh planet gear connected to the second shaft, the seventh planet gear intermeshing with the fifth sun gear, an eighth planet gear connected to the rotary output shaft of the seed rotation motor, the eighth planet gear intermeshing with the sixth gear, and a ninth planet gear intermeshing with the fifth sun gear and connected to a third shaft which projects through the sixth sun gear to provide a combined rotary output motion;

(g) a winch mounted on the sixth gear in the enclosed chamber;

(h) means connected the winch to the third shaft to provide rotary power to the winch;

(i) cable means wound about the winch to hold a seed crystal at one end and to provide for movement of the seed crystal along the central axis and for rotation of the seed crystal about the central axis; and (j) means to provide translatory motion of the winch during rotation of the sixth sun gear, to maintain the cable on the central axis during movement of the cable with the seed crystal.

10. The furnace of claim 9 which includes a sensing means to provide a signal derived from the rotation of the third sun gear so as to provide a means to determine the rate of movement and the position of the crystal in the cental shaft.

11. The furnace of claim 9 wherein the sixth sun gear is sealingly secured to the central shaft by a rotary seal and the fifth sun gear includes inner and outer bearing means, the inner bearing means allowing the fifth sun gear to rotate about the central shaft and the outer bearing means allowing the fifth sun gear to rotate relative to a fixed base on which the planetary gear differential means is positioned.

* * * * *